United States Patent [19]
Comino

[11] Patent Number: 5,805,011
[45] Date of Patent: Sep. 8, 1998

[54] SELF-CALIBRATION SYSTEM FOR LOGARITHMIC AMPLIFIERS

[75] Inventor: Vittorio Comino, Monmouth, N.J.

[73] Assignee: Lucent Technologies Inc., Murray Hill, N.J.

[21] Appl. No.: 775,989

[22] Filed: Jan. 3, 1997

[51] Int. Cl.$^6$ .............................. G06G 7/12; H03G 11/08
[52] U.S. Cl. ........................... 327/563; 327/362; 327/65; 327/350
[58] Field of Search ..................................... 327/560–563, 327/362, 538, 65, 380–352, 564; 330/253, 261

[56] References Cited

U.S. PATENT DOCUMENTS

| | | | |
|---|---|---|---|
| 5,287,070 | 2/1994 | Thelen et al. | 330/261 |
| 5,448,200 | 9/1995 | Fernandez et al. | 327/560 |
| 5,493,253 | 2/1996 | Ogou | 330/261 |
| 5,606,272 | 2/1997 | Behbahani et al. | 327/563 |

OTHER PUBLICATIONS

L.W. Chua; A GaAs MMIC For A 2–7GHz Successive Detection Logarithmic Amplifier, 1992 IEEE MTT–S Digest; pp. 179–182.

Katsuji Kimura; A CMOS Logarithmic IF Amplifier With Unbalanced Source–Coupled Pairs; Jan. 1993 IEEE Journal of Solid–State Circuits, vol. 28 No. 1; pp. 78–83.

N. Scheinberg et al.; A Monolithic GaAs Low Power L–Band Successive Detection Logarithmic Amplifier; Feb. 1994; IEEE Journal of Solid–State Circuits, vol. 29; pp. 151–154.

Mark A Smith; A GaAs Monolithic True Logarithmic Amplifier For 0.5 to 4 GHZ Applications; IEEE 1988 Microwave and Millimeter–Wave Monolithic Circuits Symposium; pp. 37–40.

A.K. Oki et al.; High–Performance GaAs Heterojunction Bipolar Transistor Logarithmic IF Amplifier; IEEE 1988 Microwave and Millimeter–Wave Monolithic Circuits Symposium; pp. 41–45.

*Primary Examiner*—Toan Tran

[57] ABSTRACT

Temperature and technology-independent self-calibrating monolithic logarithmic amplifier systems that use integrated cascades of current-summing or voltage-summing differential-limiter gain stages are disclosed. Each stage is trimmed and stabilized by a respective bias replicator cell and a current mirror cell. The bias replicator provides a bias current control signal in response to a change in a given difference between bias currents in a differential pair of amplifiers controlled by a predetermined differential calibration voltage. The differential pair is identical to a differential pair in the limiter amplifier. The differential calibration voltage $E_{lin}$ is well-within the linear portion of the amplifier's transfer curve during operation, so that the proportional relation between $E_k$ and $E_{lin}$, which is the same as that between the given difference between currents and the correct bias current value $I_B$, remains constant throughout. The bias replicator signal then varies the input bias current of the limiter amplifier to correct for temperature-related and technology-related bias-current errors. The current mirror uses an op amp connected to a calibration voltage equal to the correct limit voltage of the amplifier to detect a change from that voltage across a variable calibration resistance. The current mirror provides a signal to that variable calibration resistance to cancel that change, and to matching variable load resistances in the gain cell to correct for temperature-related and technology-related load-resistance errors.

9 Claims, 9 Drawing Sheets

SELF-CALIBRATION SYSTEM FOR LOGARITHMIC AMPLIFIERS

BACKGROUND OF THE INVENTION

1. Field of the Invention

The present invention is broadly directed to differential amplifier circuits. More particularly, the present invention pertains to the trimming and thermal stabilization of differential amplifier circuits.

2. Discussion of Related Art

Logarithmic amplification provides maximum incremental gain for small signals. The gain of these amplifiers is, nominally, inversely proportional to the magnitude of the input signal. Logarithmic amplifiers accept inputs having as much as a 56,000:1 dynamic range, and deliver a much-compressed copy of that signal at their output. This is particularly advantageous for use with analog-to-digital (A/D) converters and other decoding devices that do not respond well over such a wide dynamic range. Logarithmic amplifiers are particularly important as input amplification and demodulation devices for FM and PM modulation systems, and particularly for radar, fiber-optic and cellular receivers that must process inputs having a highly variable dynamic range such an across-the-board method of signal compression is not an option.

At frequencies up to the low megahertz range, particularly for quasi-DC slowly-varying inputs, the logarithmic relationship between the collector current and the base-emitter voltage of a bipolar-junction transistor can be used in translinear logarithmic amplifiers to provide the desired logarithmic transfer function. However, these amplifiers do not have the necessary bandwidth when operating at high closed-loop gain and, generally, at the upper end of their frequency range, they operate only within a very restricted dynamic range. Thus they have little utility in high-frequency applications.

For high frequencies, such as those in fiber optic, cellular and radar applications, a cascade of amplifiers is needed. The cascade provides some degree of signal compression at each stage. In this way a high gain is provided for small signals without losing information in the amplifier's response to larger signals, as seen in the graph in FIG. 1a. Logarithmic amplifiers conventionally used as baseband and demodulating amplifiers at the higher frequencies required by communications devices comprise a cascade of non-linear amplifier stages that simply provide progressive compression of the signal at each successive gain stage, such as the chain of dual-gain (A/1) amplifiers schematically shown in FIG. 1b.

More often, however, the cascade is made up of limiter-amplifier (A/0) stages, as shown in FIGS. 1c and 1d. Each limiter stage, individually, has a zero gain in $V_{out}$ for signal amplitudes greater than a given value $E_{sat}$, where that particular amplifier no longer responds to the input signal. Where the cascaded dual-slope amplifiers are identical, the first "piece" of the approximation ends at a so-called "log-lin" inflection point or "knee" voltage value $E_k$. This is the inflection point at the end of the first linear gain "A" provided by amplifier A1, is joined by that of the second amplifier A2, as shown in FIG. 1a.

All logarithmic amplifiers' peculiar weakness is their inherent "distortion" of the input signal relative to the output provided by linear amplifiers, a nominally logarithmic distortion that provides signal compression that is usually expressed in volts per decade or per decibel. However, if the amplifier in question is accurately calibrated and remains stable, almost any compression function can, in theory be cancelled or otherwise compensated for in later signal processing steps, whether or not it is actually a logarithmic function. Any suitable function that is stable and well-defined can be used. The compression function could even be a square-root or cube-root function, so long as it is stable and well-defined.

Thus the stability and accuracy in the "distortion" that compresses the amplifiers' input signal is the key feature of the device's transfer curve, not its accuracy as a logarithmic function. The accuracy and stability of the compression function are what assures that the compressed signal output by the amplifier can be decoded later on. Accuracy and stability are particularly important in devices used for multi-channel communications, an application where channel-matching is critically important.

Logarithmic amplifiers for these applications are commonly implemented using dual-slope amplifiers as gain stages in a progressive-compression amplifier cascade that only approximates the transfer function of a translinear logarithmic amplifier. However, unlike the truly logarithmic translinear logarithmic amplifiers, these "pseudo-logarithmic" cascades operate at frequencies up to 3 GHz with bandwidths of 500 MHz and more.

Although the elements of the cascades shown in FIGS. 1b through 1d are notionally described as dual-slope linear devices having a gain of either A or 1, and either A or 0, respectively, the amplifiers have a curved transfer function, as shown in FIGS. 1e and 1f. Wideband limiter gain stages, in particular, preferably provide "soft" limiting. The transfer function of the gain stage not only has a non-linear transition between the amplification "A" and limiting "0" slopes but it is also preferably a hyperbolic tangent curve rather than the more sharply-inflected parabolic-type curves, to produce a smoother, better-defined compression function.

For either type of curve, the output voltage at the knee voltage is not the same as the saturation voltage. That is, the so-called "knee voltage" of these devices also has a corresponding output level that is less than the maximum output level. Also the slope "A" is stated as a constant, although this slope begins to vary between A and 0 with changes in input voltage when it approaches $E_k$, as shown in FIG. 1e and FIG. 1f.

The cascaded amplifiers shown in FIG. 1b have a nominal combined gain of $A^{N-1}$ for very small input signals, up to the signal level where the first stage reaches its knee voltage $V_k$. The beginning of the third gain stage A3 is the first "mid-log" inflection, and at each subsequent mid-log inflection $V_{log}=(A-1)E_k+V_N$, and $V_{log}=(2A-1)E_k+V_N$, and so on, where $V_N$ is the input to the stage after the last knee. Thus, common errors in $E_K$ and A are additive throughout the cascade chain, so that correct biasing and trimming of all gain stages in the cascade, as well as effective thermal compensation, are critically important to controlling of the shape of the complex transfer function produced by a cascade. Evaluation and control of the individual transfer curves of the gain stages, however, is itself problematic. The problem is that the knee voltage $E_k$ and amplification factor A, values that must be stable and highly accurate in order for the cascade to produce the necessary "well-defined" compression function, are only abstract, notional values for the preferred, curved transfer function TF in each limiter gain stage.

Fabrication of Progressive-Compression Amplifier Cascades

When discrete logarithmic gain stages are combined in a cascade, the result is an uncalibrated assemblage that is difficult to trim. Alternatively, single-stage IC and hybrid dual-gain (A/1) amplifiers may be used to form the cascade, as shown in FIG. 1b. However, A/1 gain stages are generally not considered well-suited to the highly cost-effective, highly desirable monolithic fabrication techniques which reduce the space and power requirements of signal-processing circuits. Limiter (A/0) amplifiers, on the other hand, provide a progressive-compression cascade that is well-suited to monolithic fabrication.

Fully-differential implementation of the limiter-cascade gain stages is used to reduce common noise and provide greater dynamic range. The full-wave rectification provided by the cascaded limiters' differential structure also results in the ripple at the output occurring at twice the frequency that is produced by the half-wave rectification provided by conventional logarithmic amplifiers, thus simplifying the task of low-pass filtering that output. Differential signal processing also prevents the appearance of induced RF currents in the supply lines from affecting the circuit, lowering the risk of operational instability. Given the extremely high gain-bandwidth product encountered in RF logarithmic amplifier applications, in particular, this increase in operational stability provided by differential structures is highly advantageous.

Each dual-slope gain stage provides a further "multiplication" of the initial signal by voltage amplification. These voltages may be summed, as shown in FIG. 1c, but preferably auxiliary transconductance (G/O) stages such as diodes or current-switch transistor circuits provide successive detection and the resulting currents representing the voltage output of each gain stage are summed directly, as in FIG. 1d. The use of the auxiliary transconductance stages prevents reverse coupling of output signals back to sensitive nodes in the beginning of the cascade, improving the amplifier's operational stability. For most radio frequency (RF) applications, the summed current is then converted back to an output voltage, as in FIG. 3d, and low-pass filtered to recover the signal's envelope, or its video content, etc.

Auxiliary transconductance stages G/O are conventionally used to decouple the adjustments made to the small-signal slope A of each gain stage independent of knee voltage $V_k$. The gain stages' response is then controllable through the bias current level $I_B$ and the load resistance $R_L$, respectively, which simplifies the scaling of monolithic logarithmic amplifiers that use differential-pair amplifier elements in their gain stages. Even process variation can be tightly controlled, the knee voltage $E_k$ of both the transconductance stages and the gain stages in these differential-amplifier cascades is still highly temperature sensitive; therefore, control of some kind is always necessary.

Conventional Process/Temperature Compensation

Conventional bipolar pairs seek to make $E_k$ corrections proportional to absolute temperature (PTAT), in both the limiter-amplifier gain stages and in the G/O transconductance stage, for the sake of thermal stability and to reduce the effect of process variation on amplifier response. FIGS. 2a–2b are the gain cell and PTAT compensation cell of one such temperaturestabilized bipolar gain stage of a current-summing limiter-cascade, respectively. In these cells, process-induced variations in the internal resistance ($r_e$), the amplification factor (beta) and the threshold voltage ($V_T$) of bipolar differential gain stages are conventionally each individually addressed. First the size of transistors T1 and T2 is increased by a factor "B", so as to reduce the ohmic resistances of their respective base-emitter junctions R31 and R32 to $R_{31}/B$ and $R_{32}/B$. Also, individual compensation resistors R11, R12 are inserted in each stage to provide a moderate amount of emitter degeneration (5 to 25 times $V_T$) in the gain stages. These resistors counteract process variation in emitter-base resistances $r_e$ for matching the bias currents $I_B$ of all gain stages across the die.

The voltage $V_{bias}$ produced by the PTAT bias-correction cell shown in FIG. 2b provides bias current control that temperature-stabilizes the knee voltage $V_k$ of the gain cell in FIG. 2a, as well as the ohmic and beta errors of its own bipolar transistors. As disclosed in U.S. Pat. No. 4,920,909, this temperature-dependent voltage $V_{bias}$ cancels the anticipated variation in the amplifier's bias current ($I_B$), also referred to as the tail current ($I_T$), a variation that is proportional to absolute temperature (PTAT). The resistor R6 has a resistance $R_g$ that sets the gain of this cell. A resistor R7, R8 in each cell is provided to counteract process variations in emitter-base resistances $r_e$ to ensure matching bias currents $I_B$ for all PTAT cells across the die. The resistor R8 is selected to have a current that is "C/2" times as large as the current in R7. The absolute values of these resistors R7 and R8 are not critical but, rather, are set as high as supply constraints allow. Resistors R9 and R10 are usually equal.

The emitter area of the gain stage's current-source transistor T3 is also selected so that it operates at C times the current density of unit device T5 in the PTAT cell. The emitter area ratios of T4 and T5 "M" are made as high as possible, to minimize the effects of noise and process-related errors that affect M on the value of $V_{bias}$ and, given that collector loads R9 and R10 in the PTAT cell are equal, M determines the correction voltage $V_{bias}$ so that:

$$I_T = C \frac{V_T}{R_g} \ln M$$

Finally, values for B, C and M must be selected and implemented such that:

2(B/C)(1−1/M)=ln M

The addition of the gain-stage resistors and the PTAT cell and its compensation resistors then provides a temperature-insensitive gain:

$$A_{indep} = \frac{R_C}{R_G} C \ln M$$

In FIG. 2b, However, another type of compensation is desirable. The use of level-shifting devices or other types of intermediate active components such as emitter followers to couple gain stages is not desirable because those coupling devices roughly double the amplifier's total power consumption. On the other hand, direct coupling of the cascaded bipolar gain stage shown in FIG. 2a, requires compensation for the finite beta function of its transistors. Even when emitter followers are used, some such compensation is needed.

In FIG. 2b, a feedback resistance $R_{beta}$ is inserted in the feedback line returning $V_{bias}$ to the PTAT cell. This reduces the sensitivity of $V_{out}$ to the effects of temperature and production-process variability on beta. The correct value of $R_{beta}$ for achieving the desired low-sensitivity to beta in the PTAT bias generator cell is determined by the loading $R_L$ of the gain stage. For example, if emitter followers are used between gain stages, then the appropriate factor is 2 and the necessary beta correction is provided when $R_{beta} = 2(R_7 + r_e/2)$.

This piecemeal approach to trimming and thermal stabilization is costly because additional surface area on the chip must be allotted for trimmable surfaces on circuit elements and for buffer zones that prevent inadvertent damage to other circuit elements during the process of trimming any one given element. Also, to further minimize errors due to doping gradients during manufacture, mechanical stresses during packaging, and thermal gradients during operation, T4 would also be split into two devices, one on either side of the smaller device T5. This increase in the real estate required for the circuit increases unit cost.

Temperature Dependency in CMOS Gain Stages

For small signals $A=R_c/r_e$ where $R_c$ is the load when bipolar gain stages are used. Unlike bipolar gain stages, in which the factors affecting their gain are essentially linear. For example: $A=R_L/r_e=R_L I_T/2V_T$. The trimming and temperature-compensation factors affecting the gain of CMOS gain stages are non-linear. For example:

$$gm = \frac{1}{r_e} = \sqrt{W/L\ (2I_T)\ C_{ox}/\mu} = \sqrt{W/L\ (V_{gs} - V_T)\ \mu C_{ox}}$$

Thus, variations in gate-oxide thickness that vary the "oxide capacitance" ($C_{ox}$) of the structure, and variation in the mobilities ($\mu$) of negative and positive materials, and in the threshold voltage ($V_T$) are not amenable to the kind of piecemeal, ratio-based compensation conventionally used to compensate amplifier circuits that use bipolar technology. Thus some other means must be found.

The conventional approaches to controlling the trimming and thermal stability of CMOS devices do not provide a satisfactory solution to this problem. CMOS gain stage fabrication is either tightly controlled, resulting in high losses when out-of-tolerance chips are discarded or, alternatively, conventional CMOS logarithmic amplifier chips are be individually trimmed after fabrication. Trimming requires specialized test jigs. Also, as with piecewise circuit compensation schemes, in bipolar technology, trimming by ablation is costly in terms of the additional chip area used.

Even after successfully trimming CMOS devices, the transfer curves of the nominally logarithmic amplifier circuits on these chips will still vary because $\mu$ and $V_T$ change with changes in temperature. In particular, the "knee" input voltage $E_k$ for the inflection between the two slopes is strongly affected by temperature variations, in all types of dual-slope gain stages. Thus, even once out-of-tolerance CMOS cascades have been discarded, some means of providing thermal stabilization for both A and $V_k$ is required for the cascaded CMOS gain stages to function as a useful amplifier.

SUMMARY OF THE INVENTION

In accordance with the present invention, a self-compensating, self-calibrating differential amplifier circuit provides temperature stability and accurate scaling without trimming. The inventive circuit thus permits production of a smaller, cheaper, more robust monolithic logarithmic amplifier chips. In particular it overcomes the non-linear temperature and process-variation-based scaling problems associated with implementing these limiter-amplifiers in CMOS technology.

The differential amplifier comprises a gain cell having a first differential pair of amplifiers. A differential bias replicator cell is connected to supply a bias-correction signal to first second and third bias input control inputs of the gain cell, the bias replicator cell, and a current-mirror cell, respectively. The current mirror cell is connected to supply a voltage adjustment signal to a variable calibration resistance and variable load resistances of the gain cell, respectively.

The bias-correction signal is produced by the bias-replicator cell in response to a change in a difference between bias currents in respective amplifiers of a second differential pair controlled by a differential bias reference voltage. The differential bias reference voltage is selected so as to remain in the linear portion of the characteristic function of the amplifiers in the second differential pair of amplifiers during amplifier operation. The bias correction signal is adapted to cancel that change in the bias-replicator cell.

The voltage adjustment signal is produced by the current-mirror cell in response to a difference between an adjustment reference voltage and a voltage sensed across the variable calibration resistance. The voltage adjustment signal is adapted to eliminate the sensed difference between the adjustment reference voltage and the voltage sensed across the variable calibration resistance in the current-mirror cell.

In one embodiment the differential amplifiers are gain stages in a successive compression amplifier system up of differential limiter-amplifier stages, each including a transconductance element. In a particular embodiment each transconductance elements has a bias current input varied by the bias-correction signal of the differential bias replicator cell.

Preferably the voltage adjustment signal $V_{fb}$ represents a difference between a voltage reference value equal to the limit voltage of the amplifiers in the second differential pair and the voltage across the variable calibration resistance.

In a particular embodiment, the second differential amplifier pair, second and third bias input control inputs and variable calibration resistance are fabricated so as to match the first differential pair of amplifiers, the first bias-input control input, and the variable load resistances.

BRIEF DESCRIPTION OF THE DRAWINGS

The invention will be better understood when the detailed description of a preferred embodiment, given below, is considered in conjunction with the drawings provided, wherein:

FIG. 2b is a circuit diagram of a prior art PTAT cell for the gain stage of FIG. 2a;

In these drawings, like elements are assigned like reference numerals.

DETAILED DESCRIPTION OF THE PREFERRED EMBODIMENTS

Figure 1A:
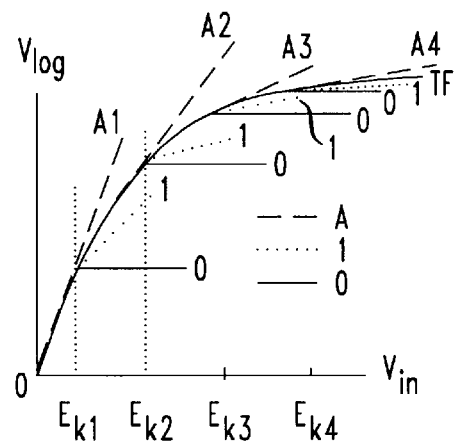
FIG. 1a is a graph showing the contribution made by the linear portion of the transfer function of each A/0 or A/1 amplifier shown in the FIGS. 1b through 1d to the quasi-logarithmic voltage output $V_{log}$ in each cascade.
Figure 1B:
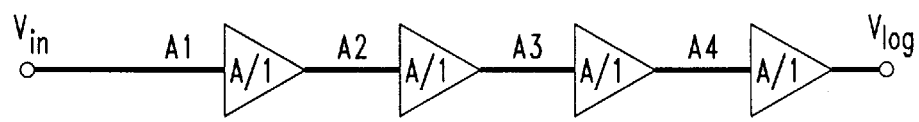
FIG. 1b is a schematic diagram of a prior art cascade of dual-gain amplifiers.
Figure 1C:
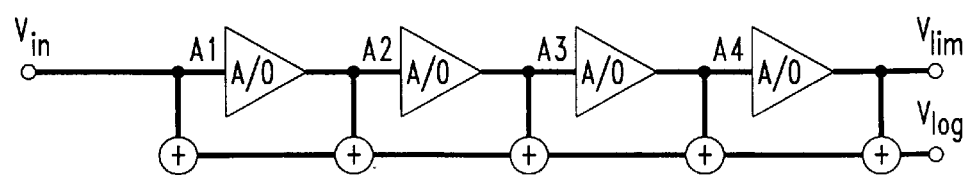
FIG. 1c is a schematic diagram of a prior art cascade of limiter amplifiers using summing junctions to provide a logarithmic voltage output.
Figure 1D:
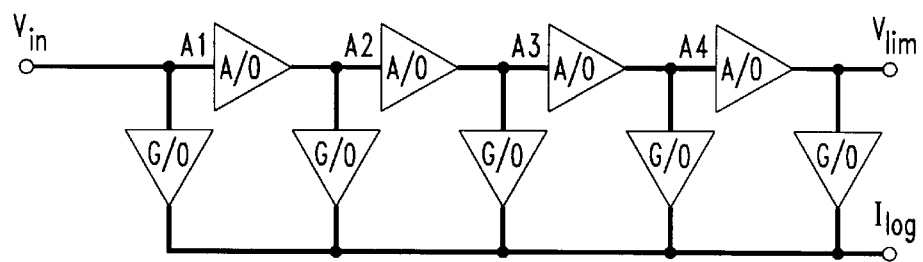
FIG. 1d is a schematic diagram of a prior art cascade of limiter amplifiers providing a logarithmic current output through respective transconductance stages G/O.
Figure 1E:
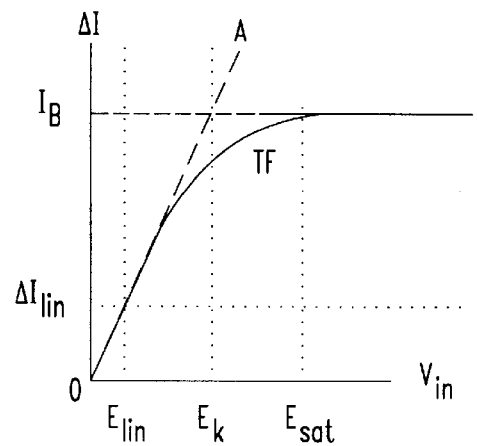
FIGS. 1e and 1f are graphs showing the deviation of differential-limiter gain stages from the notionally instantaneous change from a linear gain condition to the zero-gain cutoff condition in the limiter amplifiers.
Figure 1F:
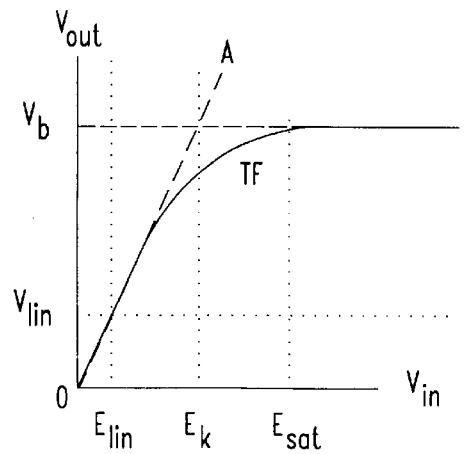
Figure 2A:
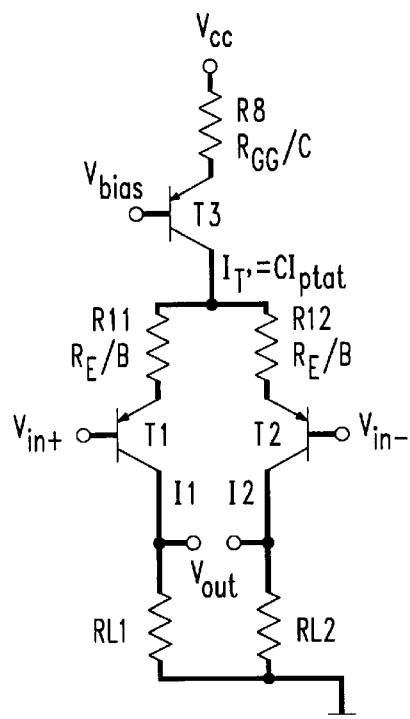
FIG. 2a is a circuit diagram of a gain cell for a prior-art bipolar logarithmic amplifier gain stage.
Figure 2B:
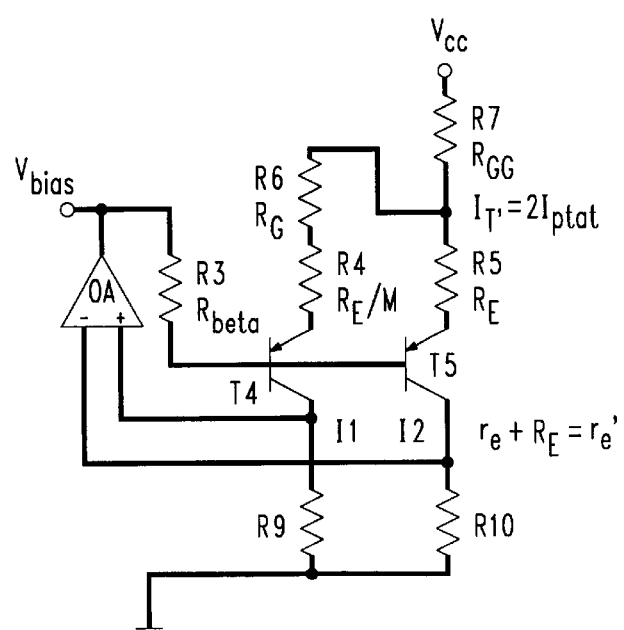
Figure 2C:
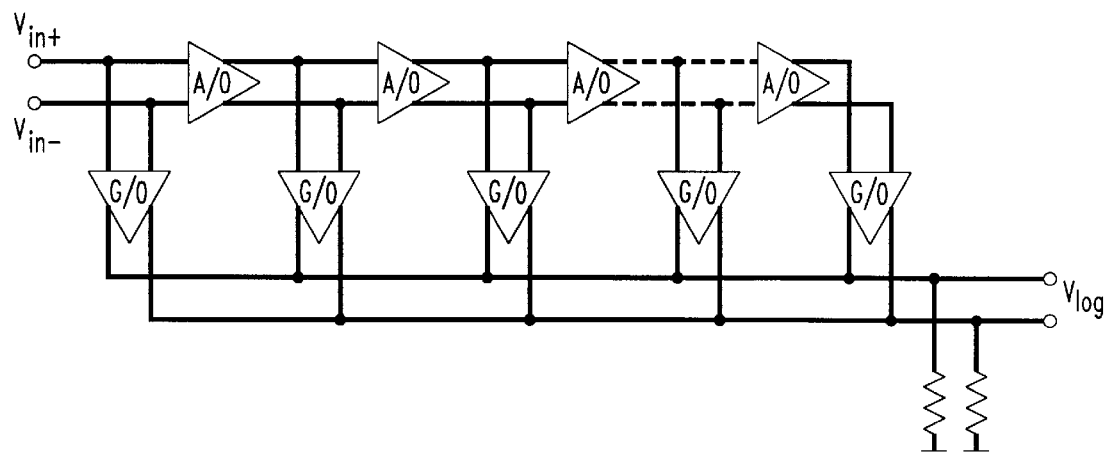
FIG. 2c is a graph showing a cascade of the differential gain stages o f FIGS. 2a and 2b.
Figure 3A:
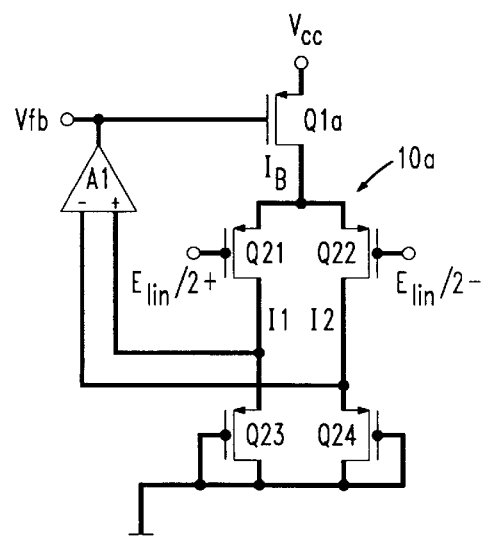
FIGS. 3a–c are circuit diagrams of component parts of a self-compensating CMOS current-summing differential limiter gain stage logarithmic voltage amplifier in accordance with the present invention.
Figure 3B:
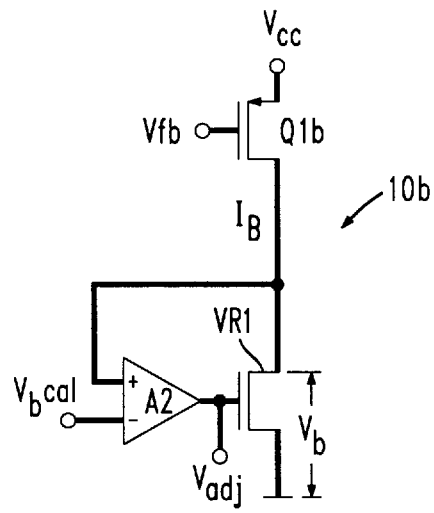
Figure 3C:
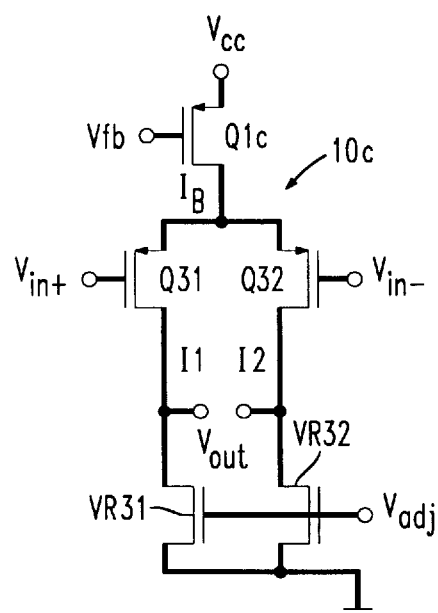
Figure 3D:
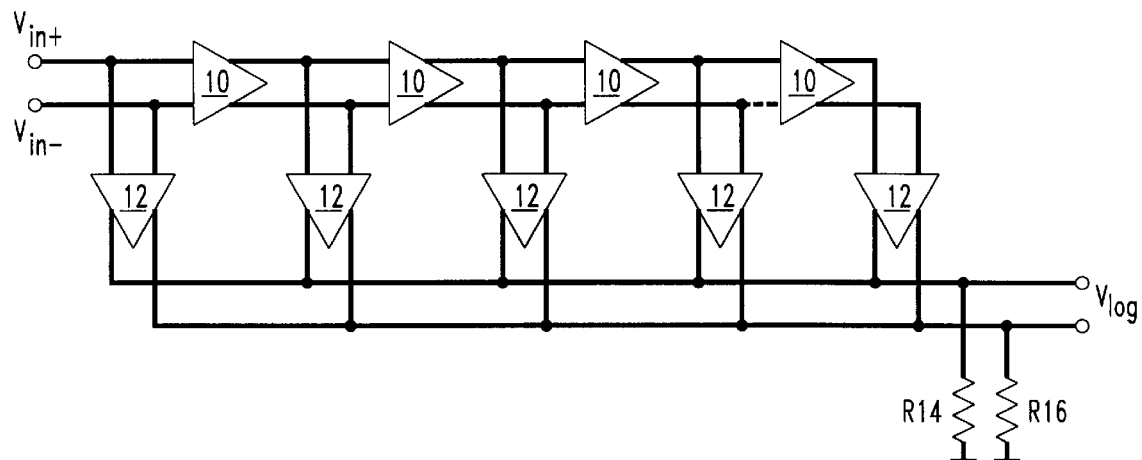
FIG. 3d is a circuit diagram of a successive-detection current-summing cascade of differential amplifiers of a first preferred embodiment using the self-compensating gain stage shown in FIGS. 3a through 3c to produce the output $V_{log}$.
Figure 3E:
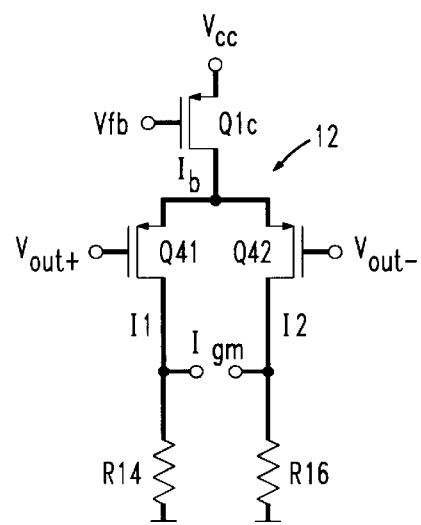
FIG. 3e is a circuit diagram of a preferred transconductance stage of the logarithmic amplifier of FIG. 3d in accordance with the present invention.
Figure 4:
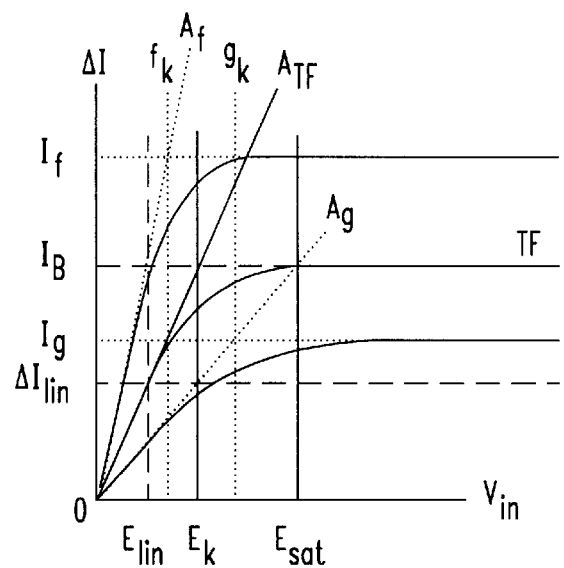
FIG. 4 is a schematic illustration of the uncorrected effect of temperature on the current $I_b$ supplied to the amplifier of FIG. 3c.
Figure 5:
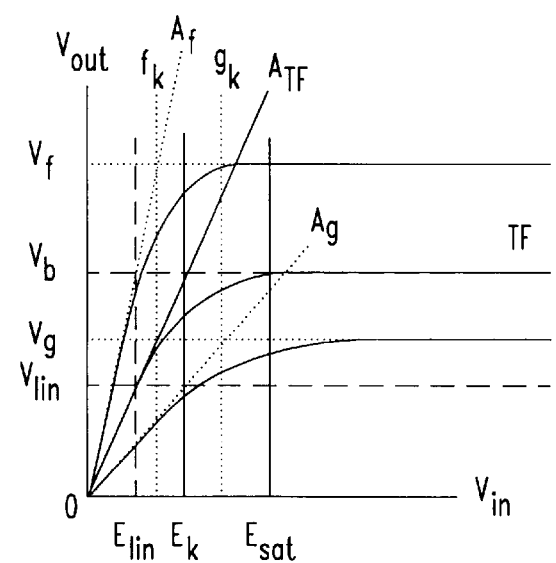
FIG. 5 is a schematic illustration of the uncorrected effect of temperature on the voltage $V_{out}$ supplied to the amplifier of FIG. 3c.

In FIGS. 3a through 3c and 3e a self-compensating system is provided for each gain stage 10 and respective transconductance stages 12, in the successive-compression amplifier cascade shown in FIG. 3d, to control the effects of temperature and process variation on the transfer function defined by $E_k$ and A. For instance, when temperature rises the curve flattens and the limit voltage $V_b$ falls to $V_g$. Conversely, when temperature falls, the limit voltage $V_b$ then increases to $V_f$, as illustrated in FIGS. 4 and 5. Process variations during manufacture also produce differences in gate oxide thickness and charge mobility in the finished chips that also cause the values $E_k$ and $V_b$ to change.

Preferably, the CMOS limiter amplifier shown in FIG. 3c is a gain stage 10 in a monolithic current-summing cascade of differential limiter gain stages 10, as shown in FIG. 3d, to minimize cost and minimize the over-all power and space requirements of the logarithmic amplifier. Alternatively, successive-compression gain stages in accordance with the present invention could be used in monolithic current-summing or voltage-summing cascades of bipolar differential limiter amplifiers, as in the second embodiment shown in FIGS. 6a through 6d.

In FIG. 3a, bias replicator transistors Q21, Q22, and the current-source transistor Q1a are constructed as copies of nearby gain cell elements Q31, Q32, and Q1c, respectively. The transistors Q21, Q22, are a symmetrical differential pair of transistors controlled by symmetrical bias voltages $E_{lin}/2+$ and $E_{lin}/2-$. The loads on the bias replicator are asymmetric, for example the emitter-followers Q23, Q24, might have emitter ratios of 25/3 and 15/3, whereas the gain cell loads R14, R16, are symmetrical, having the same value.

In accordance with the invention, a convenient current-reference value $\Delta I_e$ is selected. Preferably $\Delta I_e$ is between one-third and one-fifth of the value of $I_B$, so that it will remain on the linear portion of transfer curve for all anticipated variations in amplifier-operating conditions. The value of $I_B$ is calculated from the notional knee-voltage value $E_k$ and the small-signal gain A value specified by the design of this gain stage. The limit value $V_b$ for the output voltage and for the small-signal gain A are used as calibration control values in the design of the cascaded gain stages 10. The voltage-limit value $V_b$cal and the differential-current values $E_{lin}/2±$ are preferably derived from a 1.2 V band-gap reference voltage $V_{cal}$ that is independent of fluctuations in the supply voltage $V_{cc}$, such as the band-gap source shown in FIG. 6e.

The current source transistor Q1a is controlled by the output $V_{fb}$ of the operational amplifier A1. The negative and positive inputs of the amplifier A1 are connected to the outputs of Q21 and Q22, respectively, so that the ratio of the difference $\Delta Ie$ between the currents I1 and I2 passing through the replicator transistors Q21 and Q22 under the control of $E_{lin}/2+$ and $E_{lin}/2-$ to the total current $I_B$ remains constant. That ratio is fixed by the ratio of $E_{lin}$ to $E_k$.

To avoid the need the duplicate the bias replicator circuit connected to each gain stage for each G/O transconductance stage 12, each transconductance stage 12 is fabricated so as to replicate a nearby gain cell circuit 10c, from its bias input to its $V_{out}$ connections, which are connected to the $V_{log}$ output of the logarithmic amplifier, without the load resistances R31, R32. Thus the bias correction determined for any one stage can be applied to both a nearby gain stage and a nearby transconductance stage 12, if they are sufficiently close to each other that process and environmental differences between them are minimal.

First of all, in the bias replicator 10a, any offset in the knee voltage $V_k$ to erroneous values $f_k$ or $g_k$ is corrected by increasing the current-source bias $V_{fb}$ so as to increase $f_k$. The current-source bias $V_{fb}$ is dynamically determined as voltage needed to return the differential current I1–I2 in the replicator transistors $Q_{21}$, $Q_{22}$ to the value of the proportionally determined differential current-reference value $E_{lin}$ in the bias replicator cell FIG. 3a. Since the replicator cell 10a has a current-source transistor structure $Q_{1a}$ that is identical to the gain cell's current-source transistor $Q_{1c}$, that same current-source bias $V_{fb}$ is also the bias need for correcting the bias current $I_B$ in the gain cell 10c. The same correction is also applicable to other nearby cells 10b and 12 which also have identical current-source transistor structures $Q_{1b}$ and $Q_{1d}$. However, even though the knee value for all the cells in a gain stage is now correct, the scale of the output voltage provided by a given gain stage at the input to subsequent stages may still be incorrect, producing cumulative scale errors in $V_{log}$.

Thus, secondly in the current mirror 10b, the scale of $V_{out}$, as reflected by variations in the uncorrected value of $V_b$, monitored across VR1 by the current mirror circuit 10b, shown in FIG. 3b, is corrected by the system by varying the matched load resistances R31, R32 in the gain cell 10c. These load resistances R31, R32 are each the same size as the mirror resistance R1, so as to be subject to the same errors introduced by process and environmental variations. The operational amplifier A2 increases the correction voltage $V_{adj}$ that decreases the mirror resistance R1 until the voltage $V_b$ across R1 matches the reference value $V_b$cal that is the value of the correct limit voltage value $V_b$ determined for the gain stage by A and $V_k$ and supplied using the temperature-stable band-gap reference voltage $V_{cal}$.

The bias replicator circuit of FIG. 3a applies current-calibration voltages $V_{lin}/2\pm$. The difference $V_{lin}$ between these two current-calibration voltages $V_{lin}/2\pm$, below the given limit voltage $V_b$, corresponds to the differential current value $\Delta I_{lin}$ in the linear region below the given limit current $I_B$. That is, at $\Delta I_{lin}$ the differential current transfer curve coincides with a tangent to the curve that extends through the origin of the graph. That tangent is the notional small-signal gain A of that gain cell. Given the known ratio $E_{lin}/E_k$, and the current $I_B$ then $E_k/E_{lin}=I_B/\Delta I_{lin}$ independent of temperature and process variations, and that bias current level is then mirrored to the cells.

The graph in FIG. 4 shows the uncorrected ohmic effects of temperature on the current $I_B$ supplied to the gain cell of FIG. 3c and on the gain A of that cell itself. FIG. 5 illustrates the residual scaling errors in the limit voltage $V_b$ that would remain after gain compensation is applied to the gain cell by the bias-replicator cell of FIG. 3a, in the absence of the current-mirror compensation cell shown in FIG. 3b. For example, if the desired limit voltage is $V_b$ and the nominal gain is to be 10 dB there would be an $E_k$ of 0.316 V and perhaps a load resistance of 25 ohm and a limit current $I_B$ of 40 microamperes. Then a convenient $E_{lin}$ at one-fourth of $E_k$ would be 79 millivolts and the corresponding $\Delta I_{lin}$ at one-fourth of $I_B$ would be 10 microamperes.

An uncompensated decrease in temperature to 20° C. will produce an $I_B$ of 80 microamperes and a proportionate rise in $\Delta I_{lin}$, because that proportionate relation is temperature independent. An uncompensated rise in temperature to 100° C. will produce an $I_B$ of 20 microamperes and, similarly, a proportionate decrease in $\Delta I_{lin}$. The bias replicator in FIG. 3a uses a temperature-independent differential reference voltage $V_{lin}$ that produces $I1-I2=\Delta I_{lin}$ in the gain cell, according to the circuit's design specification. In the bias replicator cell, this reference voltage produces a null output from A1 so long as the circuit is performing according to specification. Non-null outputs from A1 oppose any change in $I1-I2$ away from $\Delta I_{lin}$, which stabilizes $I_B$ for all cells in the immediate area. In the preferred embodiment that area is limited to the one gain stage.

The current mirror circuit of FIG. 3b then adjusts the three matched variable resistances R1, R31, R32 so that the voltage across R1 to ground is $V_b$ when the current through variable calibration resistor R1 is $I_B$, as temperature compensated by the $V_{fb}$ signal. The controlling voltage $V_{adj}$ used to adjust R1 is supplied in parallel to the gain stage load resistors R31, R32. The graph in FIG. 5 shows the uncorrected effect of temperature on a gain-compensated voltage $V_{out}$ determined and supplied by the amplifier of FIG. 3c. The correction voltage $V_{adj}$ supplied by the current mirror of FIG. 3b temperature stabilizes the effective load resistance VR31, VR32 to stabilize the scale of the output voltage, using the temperature-stable correct limit voltage $V_b$cal as a reference value. In the current mirror cell, this reference voltage produces a null output from A2 so long as the actual limit voltage $V_b$ circuit is equal to that to specification. Non-null outputs from A1 oppose any change it detects in the voltage $V_b$ across VR1 by varying VR1.

Figure 6A:
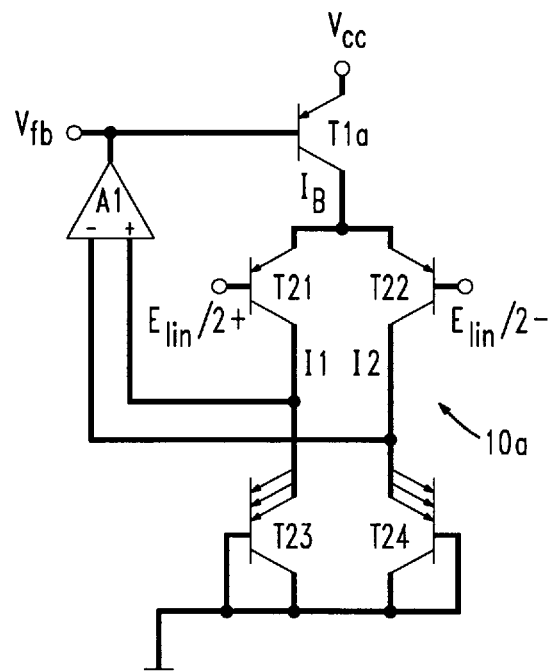
FIGS. 6a–c are circuit diagrams of component parts of a self-compensating bipolar voltage-summing differential limiter gain stage for a logarithmic voltage amplifier in accordance with the present invention.
Figure 6B:
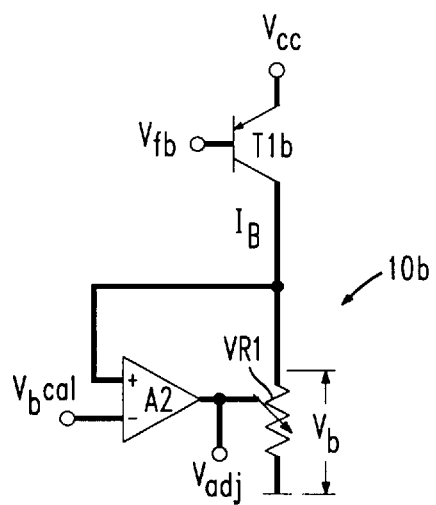
Figure 6C:
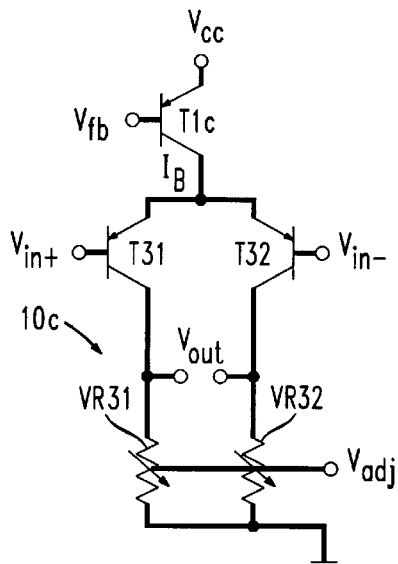

FIGS. 6a–c show the component parts of an analogous self-compensating bipolar voltage-summing differential limiter circuit in accordance with the present invention. In FIG. 6a, bias replicator transistors T21, T22, and the current-source transistor Q1a are constructed as copies of nearby gain cell elements T31, T32, and T1c, respectively. The transistors T21, T22, are a differential pair of identical transistors controlled by symmetrical bias voltages $V_{lin}/2+$ and $V_{lin}/2-$. The loads symmetric emitter-follower T23, T24, have different emitter//base ratios, 25/3 and 15/3 for example, whereas the gain cell loads VR31, VR32, are identical. The transistor pairs in this embodiment each have a beta of 100 and a 1/1 emitter-base ratio. The variable resistors, shown by generic symbols in these diagrams, may be implemented using any of several suitable technologies that are well-known in the art.

Figure 6D:
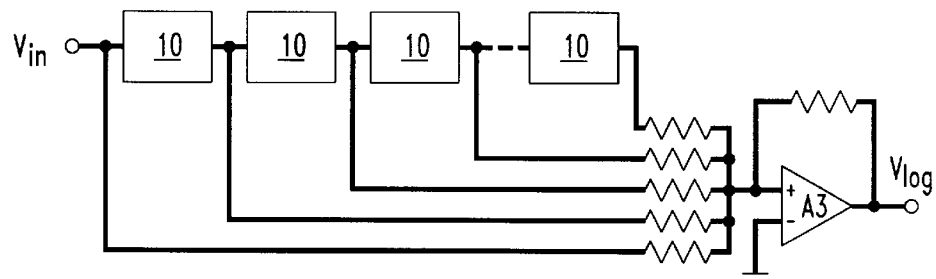
FIG. 6d is a single-line circuit diagram of a voltage-summing cascade of differential amplifiers in which a second preferred embodiment uses the self-compensating gain stage shown in FIGS. 6a through 6c.
Figure 6E:
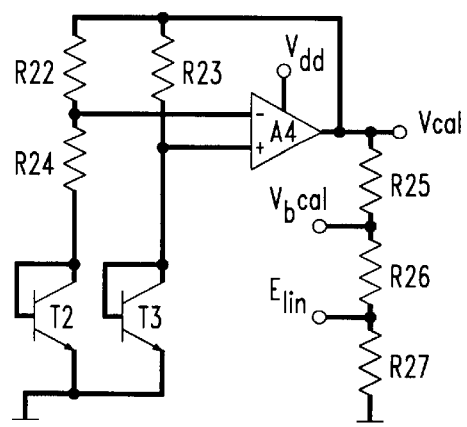
FIG. 6e is a circuit diagram of a band-gap reference-voltage generator for the calibration voltages FIGS. 6a through 6c.

The self-compensating logarithmic amplifier gain-stage circuit of FIGS. 6a through 6c may also, alternatively, be fabricated as the gain stage used in monolithic current-summing cascade as shown in FIG. 3d, rather than that shown in FIG. 6d for this embodiment. The current-summing cascade shown in FIG. 3d is particularly advantageous for high-frequency communications applications.

The invention has been described with particular reference to presently-preferred embodiments thereof. Thus, there have been shown and described and pointed out fundamental novel features of the invention as applied to a preferred embodiment thereof, but it will be understood that various omissions and substitutions and changes in the form and details of the devices illustrated, and in their operation, may be made by those skilled in the art without departing from the spirit and scope of the invention. For instance, the knee and output level in the transfer functions of other dual-slope amplifiers might be adjusted in a similar manner. Furthermore, various topological variations are possible. For example, the position of the current source may be inverted relative to the differential pair, as is well-known in the art. However, the invention disclosed above can readily be adapted by one skilled in the art to provide the desired self-compensation.

It is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Therefore, the invention is limited only by the scope of the claims appended below.

What is claimed is:

1. A monolithic self-compensating differential amplifier comprising:

a gain cell including a first bias input control input, a first differential pair of amplifier devices having respective voltage output connections and variable load resistances;

a differential bias-replicator cell having a second bias-input control input, and a second differential pair of amplifier devices and having a bias-correction output connected to said first and second bias-input control inputs, said second pair of differential amplifiers being controlled by a differential bias reference voltage selected so as to remain in a linear portion of a characteristic function of said second differential pair of amplifiers during amplifier operation, and first sensing means for producing a signal on said bias-correction output representing a change in a difference between bias currents in respective amplifiers of said second differential pair, the bias-correction signal being adapted to cancel said change; and a current mirror cell, current mirror cell having a third bias input control input connected to said bias-correction output, a variable calibration resistance connected to conduct a bias current, a voltage adjustment output, and second sensing means for producing an adjustment signal on said voltage adjustment output representing a difference between an adjustment reference voltage and a voltage sensed across said variable calibration resistance, said voltage adjustment output being connected to said variable calibration resistance and to said variable load resistances, said adjustment signal being adapted to eliminate said sensed difference.

2. The monolithic self-compensating amplifier of claim 1, wherein said second differential amplifier pair, said second and third bias input control inputs and said variable calibration resistance are fabricated so as to match said first differential pair of amplifiers, said first bias-input control input, and said variable load resistances.

3. The monolithic self-compensating amplifier of claim 1, wherein said adjustment reference voltage is a limit voltage of said first differential amplifier pair.

4. A monolithic self-compensating successive-compression amplifier system comprising:

a plurality of gain stages, each gain stage having a gain cell including a first bias input control input, a first differential pair of amplifier devices having respective voltage output connections and variable load resistances;

a differential bias-replicator cell having a second bias-input control input, and a second differential pair of amplifier devices having a bias-correction output connected to said first and second bias-input control inputs, said second pair of differential amplifiers being controlled by a differential bias reference voltage selected so as to remain in a linear portion of a characteristic function of said second differential pair of amplifiers during amplifier operation, and first sensing means for producing a signal on said bias-correction output representing a change in a difference between bias currents in respective amplifiers of said second differential pair, said bias-correction signal being adapted to cancel said change; and a current mirror cell, current mirror cell having a third bias input control input connected to said bias-correction output, a variable calibration resistance connected to conduct a bias current, a voltage adjustment output, and second sensing means for producing an adjustment signal on said voltage adjustment output representing a difference between an adjustment reference voltage and a voltage sensed across said variable calibration resistance, said voltage adjustment output being connected to said variable calibration resistance and to said variable load resistances, said adjustment signal being adapted to eliminate said sensed difference.

5. The monolithic self-compensating successive-compression amplifier system of claim 4, further comprising:

a plurality of transconductance stages each connected to a respective one of said gain stages, each having a fourth bias input control input connected to said bias-correction voltage output and a fourth differential pair of amplifier devices, said fourth bias input control input being fabricated so as to match said first bias input control input and first and amplifier devices.

6. The monolithic self-compensating successive-compression amplifier system of claim 4, wherein said gain stages are limiter gain stages.

7. The monolithic self-compensating successive-compression amplifier system of claim 4, wherein said system further includes a system output load resistance and a respective transconductance stage for each of said gain stages, said respective transconductance stage having a bias input control input connected to said bias-correction output of said differential bias-replicator cell, said system output load resistance and said transconductance stages being connected for combining voltages on said voltage output connections of said gain stages to produce a successive-compression voltage output for said amplifier system.

8. A method of self-compensating differential amplification of a gain cell having a first differential pair of amplifiers, comprising the steps of:

applying a differential bias-reference voltage to a second differential pair of amplifiers in a bias-replicator cell, said bias reference voltage being selected so as to maintain the second pair of differential amplifier pair in a linear portion of a characteristic function during amplifier operation;

applying a bias-correction signal to first, second and third bias-input control inputs of said gain cell, said bias-replicator cell and a current-mirror cell, respectively, said bias-correction signal being produced by said bias-replicator cell in response to a change in a difference between bias currents in respective amplifiers of said second differential pair controlled by said differential bias-reference voltage, said bias-correction signal being adapted to cancel said change in said bias-replicator cell;

applying a voltage adjustment signal to a variable calibration resistance and a variable load resistance in said bias-replicator cell and said gain cell, respectively, said voltage adjustment signal being produced by said current-mirror cell in response to a difference between an adjustment reference voltage and a voltage sensed across said variable calibration resistance, said voltage adjustment signal cancelling said difference in said current-mirror cell.

9. The method of claim 8, further comprising the step of:

matching said second differential amplifier pair, said second and third bias input control inputs and said variable calibration resistance to said first differential pair of amplifiers, said first bias-input control input, and said variable load resistances, respectively, during fabrication.

* * * * *